Feb. 24, 1970 R. P. ESCH ET AL 3,497,407

ETCHING OF SEMICONDUCTOR COATINGS OF $SiO_2$

Filed Dec. 28, 1966

INVENTORS
RONALD P. ESCH
WILLIAM A. PLISKIN

BY

Harry Powers
ATTORNEY

United States Patent Office 3,497,407

Patented Feb. 24, 1970

3,497,407

ETCHING OF SEMICONDUCTOR COATINGS OF $SiO_2$

Ronald P. Esch, Red Hook, and William A. Pliskin, Poughkeepsie, N.Y., assignors to International Business Machines Corporation, Armonk, N.Y., a corporation of New York Filed Dec. 28, 1966, Ser. No. 605,390
Int. Cl. H01l 7/00
U.S. Cl. 156—17 1 Claim

ABSTRACT OF THE DISCLOSURE

An etchant solution of monobasic ammonium phosphate ($NH_4H_2PO_4$) and ammonium fluoride ($NH_4F$) to enable a controlled cleanup etching of oxides from the surfaces of diffused regions in semiconductor devices masked by a composite layer of an oxide film overlaid with a diffusant-formed glassy coating. The solution produces a controlled etch wherein the etch rates of the diffusant-formed glass to the oxide is kept at a minimum. The solution is intrinsically buffered by the components to maintain a high pH, i.e. a very nearly neutral solution which is slightly acidic.

This invention relates to etching, and more particularly to an improved etching solution and method for use thereof in the fabrication of semiconductor devices.

In the manufacture of certain types of semiconductor devices, such as diffused silicon devices, it is customary in the procedure to form oxides, as for example, silicon dioxide, on the surface of the semiconductor bodies. These oxide coatings are then removed in predetemined portions to expose a region of the underlying semiconductor material into which it is desired to diffuse an active conductivity determining impurity. In this manner, the oxide coating forms a mask to monitor the subsequent diffusion and accordingly to control the area of the diffused region and the accompanying PN junction formed. In addition to forming a diffused region, the diffusant also interacts with the remaining oxide coating to form an exposed diffusant formed glassy top coating over the active surface of semiconductor devices. As discussed by Kerr et al. in the article "Stabilization of $SiO_2$ Passivation Layers with $P_2O_5$," IBM Journal of Research and Development, vol. 8, No. 4, September 1964, pp. 376–384, it is desirable to retain this diffusant-formed glassy coating since its presence on the outside of the oxide layer results in improvement in the stability of device characteristics. Accordingly, it is desirable that further processing of the semiconductor devices does not result in any substantial removal of the diffusant-formed glass coating over the surface of the semiconductor devices.

In order to adapt the semiconductor devices for connection into circuits, it is necessary that they be supplied with suitable terminals. This is normally accomplished by etching holes through the glassy coating so as to expose portions of the surfaces at the diffused regions, referred to herein as "bare regions," and then applying ohmic contacts thereto in any suitable manner, as for example, by evaporation deposition of a conductive metal, such as aluminum. Normally, these contact holes are formed to diffused region by means of photoresist masks in accordance with conventional photo-engraving techniques, followed by etching the diffusant-formed glassy coating and subsequent removal of the photoresist material, followed by any additional processing, such as thermal tailoring of the base width, acid cleaning and the like, necessary for the completion of the semiconductor device. However, such processing including photoresist removal, thermal tailoring, acid cleaning, and the like results in the re-growth or reformation of an oxide coating over the exposed diffused region of the semiconductor device, which then necessitates an additional final or clean-up etch, in order to insure maximum removal of oxides required for the formation of good ohmic contacts.

However, the use of the commonly employed etching solutions and techniques for the final or clean-up etching of contact holes in semiconductor devices, necessarily involves a destruction or erosion of the diffusant-formed glassy film, since, as discussed by Pliskin and Gnall on pages 872, 873 of the Journal of the Electrochemical Society, vol. 111, No. 7, July 1964, the etch rate is much faster for the diffusant-formed glassy layer than for the pure surface oxide.

Generally, the etch rates for the diffusant-formed glass coating and the oxide coating will vary depending on the etch being used. The etch rate of the diffusant-formed glass coating will also vary depending on its composition. For example, the etch rate of a phosphosilicate glass coating will depend on the $P_2O_5$ concentration in the glass coating, increasing with increasing $P_2O_5$ content. After phosphorus diffusion, the concentration of $P_2O_5$ in the phosphosilicate layer, is greater than it is after a subsequent reoxidation following phosphorus diffusion. For example, with a conventional buffered etchant, such as that comprised of 10 parts ammonium fluoride solution (1 lb. of $NH_4F$ mixed with 680 cc. $H_2O$) and one part hydrofluoric acid (49%), the etch rate of the phosphosilicate glass formed after phosphorus diffusion can be as high as 270 A./sec., but after reoxidizing this wafer by exposure to steam at 970° C. for 90 minutes, the etch rate of the more diluted phosphosilicate layer is reduced to 33 A./sec. The ratio of the etch rate of the phosphosilicate glass to the silicon dioxide for this conventional etch can vary from about 3 to 30 depending on the phosphorus concentration. Furthermore, the etch rate of some of the more diluted phosphosilicates used in devices is about 30 A./sec. with this etch, and it is, of course, much faster with some of the phosphosilicates used having higher phosphorus concentrations. Another conventional buffered etchant consists of 7 parts ammonium fluoride solution to one part hydrofluoric acid. The etch rate ratio for this etchant is about 10% faster on the more diluted phosphosilicates, with phosphosilicate etch rates of about 60 A./sec. According, the risk of subjecting phosphosilicate films of a thickness in the order of 1000 to 4000 A. to conventional etchants is readily apparent.

It has been discovered in the course of this invention, that the foregoing disadvantages in employing conventional etchants for final or clean-up etching of oxides from the "bare regions" in contact holes of semiconductor devices, can be drastically minimized by an etchant solution comprised of monobasic ammonium phosphate and ammonium fluoride. By use of the etchant and techniques of this invention, it is possible to obtain a drastically reduced etch rate for diffusant formed glassy film, for example phosphosilicate glass films of various $P_2O_5$ concentration, together with a low etch rate ratio between an exposed diffusant-formed glassy film and an exposed silicon dioxide film. In this manner, the invention provides means for controllable final or clean-up etching of surface oxides formed on the "bare regions" within contact holes delineated by an adjacent exposed layer of diffusant-formed glassy coating. The composition of the etchant solution and the process steps for the use thereof, will be hereinafter described in greater detail in the specific embodiments of this invention set forth below.

Accordingly, it is an object of this invention to provide an improved etchant for the surfaces of semiconductor devices.

It is a further object of this invention to remove oxides from the surfaces of semiconductor devices.

It is also an object of this invention to provide an etchant for controlled removal of a surface oxide layer with minimal attack of an adjacent exposed diffusant-formed glass overcoating on an adjacent portion of the same surface.

It is also an object of this invention to provide a novel etchant and a method for etching a plurality of semiconductor surfaces at controllable rates.

A still further object of this invention is to controllably remove oxides from the exposed surfaces of of semiconductor bodies, masked by a diffusant-formed glassy coating having a higher susceptibility to conventional etchants.

The foregoing and other objects, features and advantages of the invention will be apparent from the following more particular description of the preferred embodiments of the invention, as illustrated in the accompanying drawings, wherein.

Figure 2:
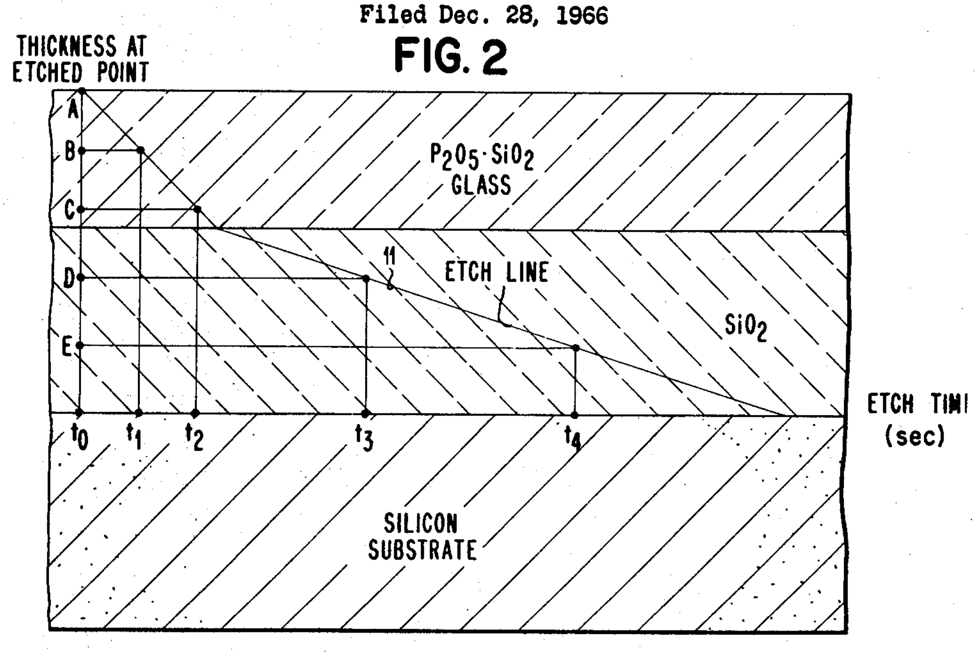
FIG. 2 is a generalized etch-rate plot superimposed over a cross-section of a semiconductor device sequentially coated with an oxide layer and a diffusant-formed glassy layer.

Broadly speaking, it has been found in accordance with this invention that adjacent exposed layers of an oxide and a diffusant-formed glassy coating can be selectively and controllably etched by means of an etchant solution comprised of ammonium fluoride and monobasic ammonium phosphate. In general, the relative proportions and dilutions of the components in the solution can be varied over a wide range which provides solutions having a pH less than 7 while still providing the enumerated advantages. Preferably, the etchant will be an aqueous solution with a pH in the range of about 6 to about 6.8 and containing from about 10 to 35 weight percent ammonium fluoride and from about 2 to 10 weight percent monobasic ammonium phosphate. The etchant solution of this invention can be readily prepared by mixing the indvidual components together in water by well known techniques. A convenient method of preparing the etchant is by mixing together individually pre-formed solution of the components. Thus, a presently preferred etchant of the present invention having a pH of about 6.7, can be conveniently prepared by mixing together 2 parts by volume of a 40 weight percent ammonium fluoride solution with about 1 part by volume of a 12.5 weight percent monobasic ammonium phosphate solution. However, it is to be understood that where etching times are not a material consideration, the relative proportions and amounts of the components can be, as indicated, varied over wider ranges than set out above; and satisfactory results are readily obtained when the relative proportions of ammonium fluoride solution to monobasic ammonium phosphate solution is within the range of about 1:4 to about 5:1. In general, permissible dilutions for specific applications can be readily determined by one skilled in the art.

The etchant solution of this invention has been found particularly effective for removing re-formed surface oxides from within contact holes formed over phosphorus diffused regions of silicon semiconductor devices and delineated within diffusant-formed phosphosilicate glass coatings.

For purposes of convenience, such an indicated diffusant device modified with an overcoating of a diffusant-formed glassy film will be referred to hereinafter as a "diffusant passivated silicon device." As can be seen in such an indicated application with "diffusant passivated silicon device," the etchant solution of the invention minimizes the differences in etch rates thereof between a silicon surface oxide and the adjacent exposed layers of diffusant-formed phosphosilicate glass films. Upon deposition of aluminum terminals to the final etched diffused regions, improved ohmic contact was obtained. Although the description will be primarily directed to the application of the etchant of this invention in the controlled etching of exposed and coexistent coatings on a silicon semiconductor device, of silicon dioxide and diffusant-formed phosphosilicate glass films, it is to be understood that the etchant has also been useful and general application for removal of oxides from the surfaces of other commonly used semiconductor materials such as germanium.

The conditions under which the etchants of this invention can be used may be varied over fairly wide ranges, and thus are not critical. In general, conventional etching techniques may be employed. Normally, the choice of etching conditions will be governed by various factors, as for example, rates of etching, thickness of films exposed to the etchant, the composition of the films to be etched, and the like. In like manner, the temperature at which the etchant solution of this invention is employed is not critical, but for practical purposes will generally be in the range of about 20 to 30° C., and the contact time for the etching will depend on the amount of etching required under the chosen conditions.

Actually, only a simple test is required to correlate the etching time with the strength of the etchant and the temperature employed, which normally will be at ambient temperatures. With an etchant solution of this invention at room temperature, it can readily be checked by determining its etch rate for silicon dioxide films. This can be done simply by using a sample or test surface oxidized silicon semiconductor device (hereinafter referred to for purpose of convenience as an "oxide device"), which surface film oxide, i.e. silicon dioxide, for purpose of illustration may be assumed to have a typical thickness of approximately 5500 A. A stripe of black wax can be painted or suitably deposited in any manner on the oxide surface of the device, and then etched for a few minutes in the etching solution, followed by removal of the wax with trichlorethylene. The thickness loss can then be determined accurately by use of any conventional techniques, such as Tolansky interferometry, Vamfo, or other interferometric techniques. An etch rate found by such a simple test was typically in the range of about 0.7 to about 1.3 A./sec. for the silicon dioxide film. From the etch rate found in this manner, it is relatively simple to determine the time required to remove a desired amount of oxide. The required length of etch can, for purposes of illustration, be then selected which will be sufficient to remove five fold the amount of silicon dioxide which re-formed over the "bare regions" within the contact holes.

A typical example thickness of such re-growth or re-formation of silicon dioxide which results from two thermal tailorings of 90 minutes each, is of the order of 25 A. thickness. These very thin oxides etch at slightly faster rates than that determined for thicker oxide films (>2000 A.) and therefore with the etch rate indicated for the sample surface oxidized silicon device, a 40 second etch will be more than sufficient for the removal of the silicon dioxide coating which reformed over the "bare regions." With such etch ratios for the silicon dioxide film obtained by the etchants of this invention, the amount of phosphosilicate glass that will be removed by the etchant will be in the range of about 60 to 120 A. depending upon the phosphous concentration in the outer layer of the phosphosilicate glass. For phosphosilicate devices having phosphosilicate coatings in the range of about 1500 to 2900 A., as typically found in practice, the etchants provide a multiple safety factor for etch times of 40 seconds. In fact, with the minimized etch rates provided by the etchants of this invention, even an etching time of 300 seconds has an adequate safety factor.

In Example 1 below, the etch rates for silicon dioxide and phosphosilicate glass were studied. The etch rate for silicon dioxide was determined on semiconductor devices overcoated with only a genetically grown film of silicon dioxide. For the determination of etch rates for phosphosilicate glass films, silicon semiconductor devices were employed having a genetically grown layer of silicon oxide which in turn is overlaid with a thin contiguous coating of diffusant-formed phosphosilicate glass formed by exposing a silicon dioxide coated semiconductor device to phosphorus pentoxide under diffusion conditions, followed by reoxidation of the silicon. In all cases, including other examples of this application, the thickness of tne various films on the semiconductor devices were measured by the Vamfo technique which is an interference microscope developed for accurate, nondestructive, film thickness measurements. A complete description of the Vamfo technique may be found in the article by W. A. Pliskin and E. E. Conrad entitled "Nondestructive Determination of Thickness and Refractive Index of Transparent Films," pp. 43–51, IBM Journal of Research and Development, vol. 8, No. 1, January 1964.

EXAMPLE 1

An etchant solution at ambient temperature and a pH of about 6.7 was prepared by mixing two parts by weight of a 40 weight percent ammonium fluoride solution to 1 part by weight of a 12.5 weight percent monobasic ammonium phosphate. An "oxide device" having a 0.553 micron thickness of silicon oxide was immersed in the etchant for 5 minutes. Upon removal of the etchant the remaining thickness of silicon dioxide was found by the Vamfo technique to be 0.521 micron. This corresponds to a 320 A. loss in the silicon dioxide layer, which for the 5 minute etch, represents an etch date of 1.07 A./sec.

In conjunction with the foregoing, a diffusant passivated silicon device, having a combined thickness for the phosphosilicate glass and silicon dioxide films of 1.030 microns was immersed in the etching solution for 200 seconds. Upon removal from the etchant, the remaining thickness of the combined films of silicon dioxide and phosphosilicate was found, by the Vamfo technique, to be 0.077 micron. This corresponds to a 530 A. loss in the phosphosilicate glass film which for the 200 second etch represents an etch rate of 2.65 A./sec.

At these etch rates, the etch rate ratio of the phosphosilicate glass to the silicon dioxide is 2.65 A./sec. to 1.07 A./sec. or 2.48.

Figures 1A, 1B, 1C, 1D, 1E:
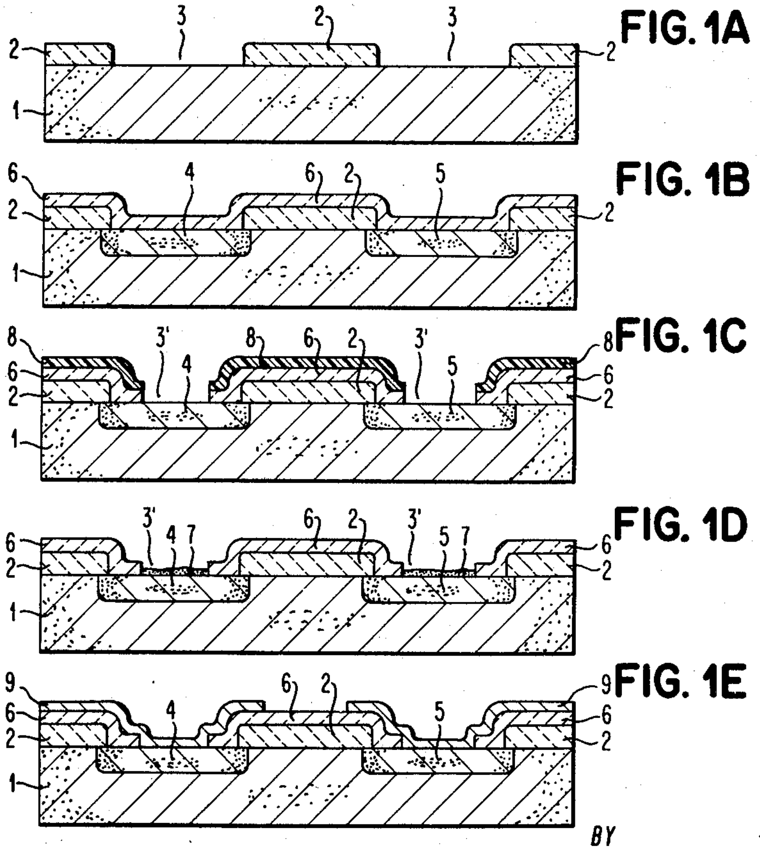
FIGS. 1A to 1E are sectional views representing a portion of an array of semiconductor devices during various steps and the manufacturing thereof.

Referring to the drawings, FIGURES 1A to 1E show a typical fabrication of solid state electronic devices, for example, an insulated gate field effect transistor of the type contemplated for use with the etchants of this invention. As illustrated in FIGURE 1A, there is represented a cross-section of a fragmentary portion of a semiconductor substrate 1 from which a single one of plurality of transistor units are fabricated. As will be understood, in the microminiaturized fabrication of semiconductor devices the fabrication process usually involves the fabrication of a large array of a semiconductor unit, which may comprise several hundred units on a parent semiconductor substrate, i.e. a wafer, having the dimensions of about 6 mils thickness and 1¼ inches diameter. The wafer is then subdivided into individual semiconductor units or "chips" having typical areas as small as 20 x 20 mils. However, for use of description, the fabrication of the transistor unit will be described in terms of a single unit or chip.

As shown in FIGURE 1A, an adhering insulating layer 2 of an oxide is deposited over the surface of substrate 1. While various surface oxide films may be employed, for silicon substrates this film is preferably a genetic oxide layer grown from the parent silicon body by means other than simply exposing this silicon body to the atmosphere. Such a genetic oxide film may be derived from the parent silicon body by various means that are well known in the art, such as by electro-chemical treatment or by heating the body between 900° C. and 1400° C. in an oxidizing atmosphere of oxygen or an atmosphere of steam. U.S. Patent 8,802,760 of Derick et al., granted Aug. 13, 1957, and entitled "Oxidation of Semiconductor Surfaces for Controlling Diffusion" describes one such treatment.

Apertures 3 are then formed at predetermined locations in the film 2 by conventional photoengraving techniques. As an example, in a manner well known in the art, a photoengraving resist (not shown) is placed over the silicon dioxide film 2 and the resist is then exposed to a master photographic plate having opaque areas corresponding to the regions from which the oxide film is to be removed. In the photographic development, the unexposed resist is removed. The mask assembly is then immersed in any conventional etchant solution which dissolves silicon dioxide, such as a solution of buffered hydrofluoric acid to form the apertures 3 in the regions exposed by the resist. The remaining resist is then dissolved and washed off to produce the assembly shown in FIGURE 1A, comprising the silicon substrate 1 and the overlying silicon dioxide layer 2, having therein the apertures 3, through which the underlying silicon is subjected to conventional diffusion operations wherein a suitable conductivity determining impurity, for example a phosphorus compound such as phosphorus pentoxide, is diffused through apertures of "diffusion windows," 3 into the semiconductor substrate 1 to establish therein the source and drain diffusion regions 4 and 5. Concurrent with the formation of the diffused regions 4 and 5, the diffusant, e.g. phosphorus pentoxide, also reacts with the silicon dioxide coating 2 to form a glassy film overcoat 6 over the surfaces of the assembly. A typical diffusion operation will involve heating the assembly of FIGURE 1A at a temperature ranging between 900° C. and 1250° C. in a reactive atmosphere, e.g. phosphorus pentoxide ($P_2O_5$) to form the n-type source and drain diffusions 4 and 5.

In order to adapt the semiconductor unit for connection in the circuits, contact holes 3' may be suitably formed through the phosphosilicate glass coating 6 to expose portions of the surfaces at the diffused regions 4 and 5, hereinafter referred to as "bare regions." These contact holes may be formed by use of a second photoresist pattern 8 which is again exposed and developed in accordance with conventional photoengraving techniques, so as to mask the glassy layer 6 over the portions of the diffused regions 4 and 5 through which the contact holes are to be formed. This masked assembly may then be immersed in a conventional etchant solution which dissolves the diffusant-formed glassy coating, typically the buffered hydrofluoric acid solution referred to previously, to form the contact holes 3' and the remaining resist may then be dissolved and washed off to produce the assembly shown in FIGURE 1C. For these foregoing etching operations, the etchant force is not critical, and thus conventional etchants may be employed.

The assembly is then usually subjected to additional processing (such as acid cleaning, base width tailoring by heating, and the like) prior to deposition of electrodes to the various conductivity type regions. However, such further processing can result in the reformation or regrowth of silicon dioxide film 7 over the diffused regions 4 and 5 which necessitates an additional clean-up etch in order to assure maximum freedom of oxide required for the formation of good ohmic contact with deposited electrodes. Typically in such additional processing two thermal tailorings of 90 minutes will induce a growth of a 25 A. thick film of oxide over the "bare region," and at 14 A. thickness of oxide will result from a 10 minute acid cleaning at 140° C. in sulfuric acid. A clean-up etch for removing such a reformed film of the oxide is critical, since there must be only a minimal effect on or etching of the diffusant-formed phosphosilicate glassy film 6.

Accordingly, in order to minimize the removal of the diffusant-formed phosphosilicate glass film 6, the re-formed oxide 7 can be removed from within the contact holes by immersion of the device, in accordance with this invention, in a solution comprised of ammonium fluoride and monobasic ammonium phosphate having a pH in the range of 6 to 6.8 for a time sufficient, as indicated in the above-referred to test, to insure the complete removal of the oxide layer 7. Thereafter, to complete the transistor, a thin film 9 of conductive metal such as aluminum, is suitably deposited, as by evaporation, on the etched bare portions of the surfaces over the diffused regions 4 and 5, and on selected portions of the phosphosilicate glass film 6 in the manner shown in FIGURE 1E.

FIGURE 2 illustrates a fragmentary portion of a semiconductor device for purposes of explaining the mode of etching these devices. As shown in FIGURE 2, a generalized etch rate plot is superimposed over the cross-section of a semiconductor device such as obtained by FIGURES 1A–1E, with the time coordinate coextending horizontally with the interface between the silicon substrate and the silicon dioxide component film, and with the coordinate of the film thickness extending vertically through the silicon dioxide film component and the outer phosphosilicate glass layer. Etching was accomplished in incremental time steps so as to successively etch through the two film components at the points indicated along the etch line 11 shown in FIGURE 2.

EXAMPLE 2

In order to provide a basis for comparison, a conventional etchant was prepared by mixing 7 parts by volume of 40 weight percent ammonium fluoride solution with 1 part by volume of 49 weight percent hydrofluoric acid to provide an etchant solution of 4.5 to 5 pH which was maintained at substantially 25.4° C. A phosphosilicate device was periodically immersed in the etchant solution for time periods indicated in Table I below so as to progressively etch through the layers of phosphosilicate glass and silicon dioxide. After each etch period the device was blown air dry, and the remaining film thickness measured by the Vamfo technique. The original thickness of the conjoint layers of phosphosilicate glass and silicon dioxide was 1.1470 microns. The etch period and the results thereof are shown in Table I below which is correlated with the plot of FIGURE 2.

TABLE I

| Etch time, seconds | | | Total film thickness | |
|---|---|---|---|---|
| At point | Progressive | Increment | Microns | At point |
| $T_0$ | 0 | 0 | 1.1470 | A |
| $T_1$ | 10 | 10 | 1.0930 | B |
| $T_2$ | 25 | 15 | 0.9920 | C |
| $T_3$ | 65 | 40 | 0.8860 | D |
| $T_4$ | 125 | 60 | 0.7680 | E |

To preclude any effect of outdiffusion of phosphorus near the surface, the etch rates were determined for times $T_1$–$T_2$ and $T_3$–$T_4$ which represent, respectively, the remaining thickness of the phosphosilicate glass film and a silicon dioxide films as represented respectively at points B–C and D–E on FIGURE 2.

As can be seen from the table, the amount of the phosphosilicate layer removed during the time period $T_1$–$T_2$ of 15 seconds, extends from points B–C, and is 0.1010 micron or 1010 A. For this etch period $T_1$–$T_2$ of 15 seconds, this represents an etch rate of 67.3 A./second. The etch rate for silicon dioxide is similarly calculated for the time period $T_3$–$T_4$ (60 seconds) which provided a 0.1180 micron or 1180 A. loss in the silicon dioxide film, and represents an etch rate of 19.6 A./second. From these calculations, the etch ratio is found to be 3.43, which shows that the phosphosilicate glassy film is etched at a rate 3.43 times faster than the etch rate for the silicon dioxide layer.

EXAMPLE 3

Example 2 was repeaed with the exception that etchant of this invention was employed by mixing together 1 part by volume of 40 weight percent ammonium fluoride solution with 1 part by volume of a 12.5 weight percent monobasic ammonium phosphate solution. The etch times at ambient temperature and results are shown in Table II.

TABLE II

| Etch time, seconds | | | Total film thickness | |
|---|---|---|---|---|
| At point | Progressive | Increment | Microns | At point |
| $T_0$ | 0 | 0 | 1.113 | A |
| $T_1$ | 250 | 250 | 1.032 | B |
| $T_2$ | 710 | 460 | 0.942 | C |
| $T_3$ | 1,310 | 600 | 0.872 | D |
| $T_4$ | 1,770 | 460 | 0.814 | E |

As can be seen from Table II, for the etch period $T_1$–$T_2$ of 250 seconds, 0.0181 or 810 A. of the phosphosilicate glass film was removed to give an etch rate of 3.24 A./second. Similarly, for the etch period $T_3$–$T_4$ of 460 seconds, 0.0580 micron of silicon dioxide film was etched which is equivalent to an etch rate of 1.26 A./sec. From these results it is readily seen that the etch rate for the phosphosilicate glass film to the silicon dioxide layer is 2.57, indicating that the phosphosilicate glass film etched at a rate only 2.57 times faster than the silicon dioxide in the specified etch solution of this invention.

EXAMPLE 4

Example 2 was repeated with the exception that a solution of this invention was prepared by mixing together 2 parts by volume of 40 weight percent ammonium fluoride solution with 1 part by volume of 12.5 weight percent monobasic ammonium phosphate solution. The etch times and results are shown in Table III below.

TABLE III

| Etch time, seconds | | | Total film thickness | |
|---|---|---|---|---|
| At point | Progressive | Increment | Microns | At point |
| $T_0$ | 0 | 0 | 1.1215 | A |
| $T_1$ | 200 | 200 | 1.0720 | B |
| $T_2$ | 600 | 400 | 0.9720 | C |
| $T_3$ | 1,200 | 600 | 0.8900 | D |
| $T_4$ | 1,600 | 400 | 0.8430 | E |

From Table III it can be seen that 0.1000 micron or 1000 A. of the phosphosilicate glass film was etched in the Time period $T_1$–$T_2$ of 400 seconds which corresponds to an etch rate of 2.5 A./second. Also in the time period $T_3$–$T_4$ of 400 seconds, 0.0470 micron or 470 A. of the silicon oxide layer was etched, which corresponds to an etch rate of 1.18 A./second. From these etch rates it can be seen that the ratio of the etch rate of the phosphosilicate glass film to the etch rate for the silicon dioxide layer is $$\frac{2.5\ \text{Å/sec.}}{1.18\ \text{Å/sec.}}$$

or 2.12.

EXAMPLE 5

Example 2 was repeated with the exception that the etching solution employed was prepared by mixing together 4 parts by volume of a 40 weight percent ammonium fluoride solution with 1 part by volume of 12.5 weight percent monobasic ammonium phosphate solution. The etch times and the results are indicated below in Table IV.

TABLE IV

| Etch time, seconds | | | Total film thickness | |
|---|---|---|---|---|
| At point | Progressive | Increment | Microns | At point |
| $T_0$ | 0 | 0 | 1.138 | A |
| $T_1$ | 200 | 200 | 1.092 | B |
| $T_2$ | 600 | 400 | 1.024 | C |
| $T_3$ | 1,200 | 600 | 0.947 | D |
| $T_4$ | 1,600 | 400 | 0.915 | E |

From Table IV it can be seen that 0.068 microns of phosphosilicate glass film was etched in the etch period $T_1$–$T_2$ of 400 seconds for an etch rate of 1.7 A./second. Similarly, 0.032 microns or 320 A. of silicon dioxide layer was removed in the time period $T_3$–$T_4$ of 400 seconds for an etch rate of 0.8 A./second.

From the foregoing the etch rate ratio oft he phosphosilicate glass film to the silicon dioxide layer is found to be $$\frac{1.7\ \text{Å/sec.}}{0.8\ \text{Å/sec.}}$$

or 2.12.

From the foregoing examples, it can be seen that the etch rate ratios of the etchant solutions of this invention, for the particular application of clean-up or final etching of contact holes in phosphosilicate devices is significantly less than that of conventional solutions, see Example 2. Furthermore, the etch rates themselves are more than an order of magnitude less with the etchant solutions of this invention than with conventional etches and thus better control can be maintained. As a result, the use of the etchant solutions of this invention for the clean-up or final etching of contact holes in phosphosilicate devices minimizes the removal of the phosphosilicate glass layer formed during phosphorus diffusion of silicon semiconductor substrates. Such etch rates in conjunction with the improved ohmic contact obtained provides a means for producing semiconductor devices in improved yield and reliability.

While the invention has been particularly shown and described with reference to the preferred embodiments thereof, it will be understood by those skilled in the art that the foregoing and other various changes in form and details may be made therein without departing from the spirit and scope of the invention.

What is claimed is:

1. A method of selectively etching a silicon semiconductor having an exposed film of silicon dioxide on a first portion of the surface thereof and an exposed diffusant-formed phosphosilicate glassy film on an adjacent second portion of said surface which comprises contacting said film of silicon dioxide and said glassy film with an aqueous solution comprised of about 2 to 10% by weight of monobasic ammonium phosphate and 10 to 35% by weight of ammonium fluoride.

References Cited

UNITED STATES PATENTS 3,107,188 10/1963 Hancock ---------- 156—17
3,226,611 12/1965 Haenichen ---------- 317—234

JACOB H. STEINBERG, Primary Examiner

U.S. Cl. X.R.

148—1.5; 252—79.3